(12) United States Patent
 Kawasumi

(10) Patent No.: US 9,196,338 B2
(45) Date of Patent: Nov. 24, 2015

(54) MAGNETORESISTIVE MEMORY DEVICE WITH REDUCED LEAKAGE AND HIGH SPEED OPERATION IN AN SOC

(71) Applicant: Kabushiki Kaisha Toshiba, Minato-ku (JP)

(72) Inventor: Atsushi Kawasumi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 132 days.

(21) Appl. No.: 14/019,865

(22) Filed: Sep. 6, 2013

(65) Prior Publication Data

US 2014/0071745 A1 Mar. 13, 2014

(30) Foreign Application Priority Data

Sep. 10, 2012 (JP) ................................. 2012-198269
Aug. 28, 2013 (JP) ................................. 2013-177298

(51) Int. Cl.
*G11C 11/16* (2006.01)
*G11C 7/06* (2006.01)
*G11C 13/00* (2006.01)
*G11C 5/14* (2006.01)

(52) U.S. Cl.
CPC ............ *G11C 11/1673* (2013.01); *G11C 7/062* (2013.01); *G11C 11/161* (2013.01); *G11C 13/004* (2013.01); *G11C 13/0026* (2013.01); *G11C 5/147* (2013.01); *G11C 11/16* (2013.01); *G11C 2013/0054* (2013.01)

(58) Field of Classification Search
CPC ........ G11C 11/16; G11C 5/147; G11C 7/062; G11C 11/1673
See application file for complete search history.

(56) References Cited

U.S. PATENT DOCUMENTS

| 7,295,465 B2* | 11/2007 | Tanizaki et al. | 365/171 |
| 7,616,513 B1* | 11/2009 | Peng et al. | 365/207 |
| 2002/0122336 A1* | 9/2002 | Morikawa | 365/189.09 |
| 2012/0212994 A1* | 8/2012 | Tsushima et al. | 365/148 |
| 2013/0322161 A1* | 12/2013 | Noguchi et al. | 365/158 |

OTHER PUBLICATIONS

Kenji Tsuchida et al. "A 64Mb MRAM with Clamped-Reference and Adequate-Reference Schemes", ISSCC 2010 / Session 14 / Non-Volatile Memory / 14.2, 2010 IEEE, 2010, 3 pages.

* cited by examiner

*Primary Examiner* — Richard Elms
*Assistant Examiner* — Ajay Ojha
(74) *Attorney, Agent, or Firm* — Oblon, McClelland, Maier & Neustadt, L.L.P.

(57) ABSTRACT

According to one embodiment, a magnetoresistive memory device includes first and second bit lines, a memory cell, a power supply line, first and second transistors, and third and fourth transistors. The memory cell has first and second magnetoresistive elements and is connected between the first and second bit lines. The power supply line is connected between the first and second magnetoresistive elements. The first and second transistors have current paths inserted in the first and second bit lines, respectively, and have gate electrodes connected, respectively to the second and first bit lines provided on a side opposite to the memory cell. The third and fourth transistors are inserted in the first and second bit lines. Gate electrodes of the third and fourth transistors are cross-coupled, and the third and fourth transistors are controlled by current from the memory cell.

20 Claims, 14 Drawing Sheets

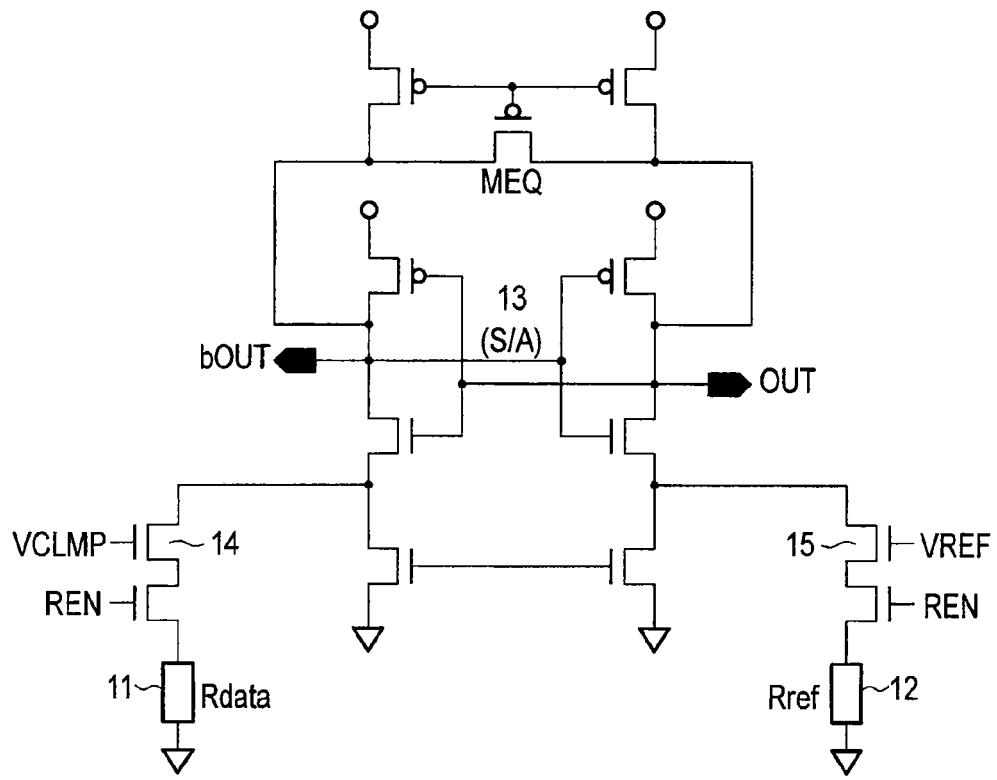
F I G. 1
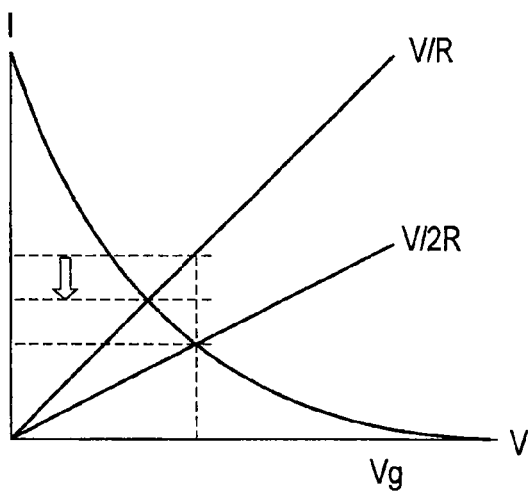
F I G. 2

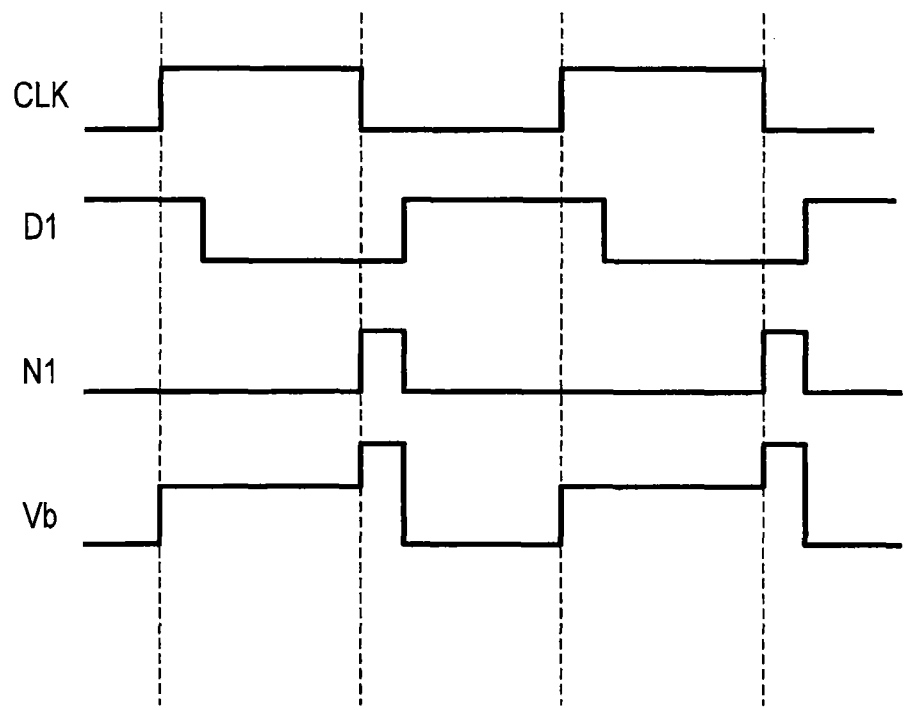
F I G. 9
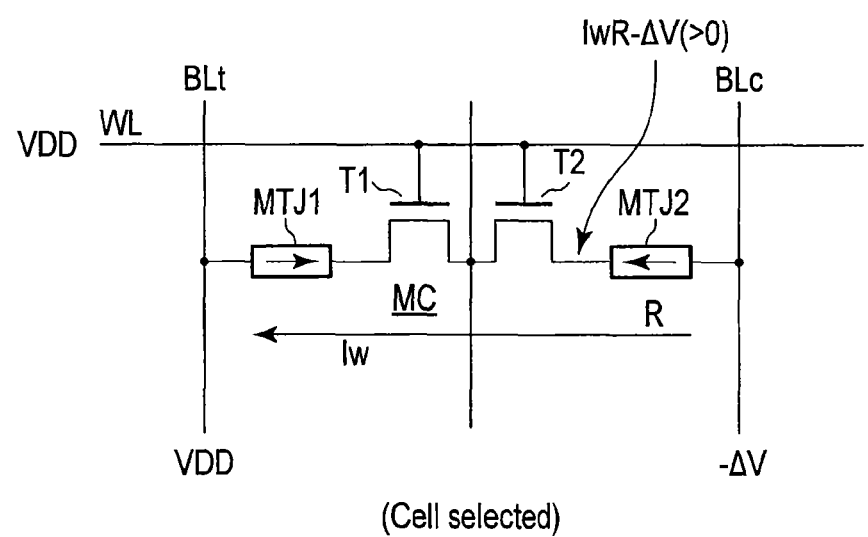
F I G. 10

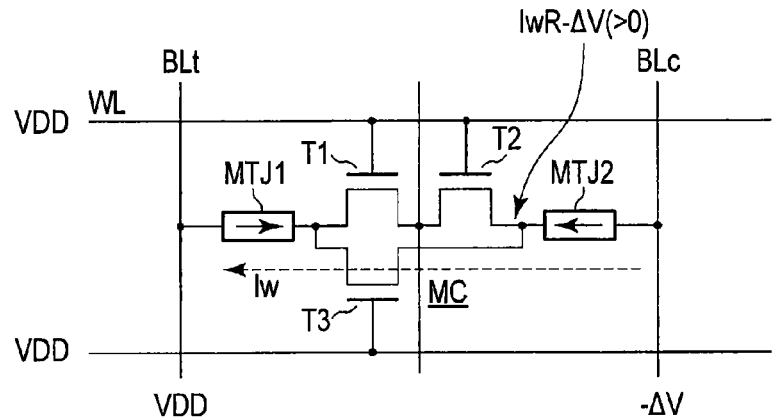
F I G. 15
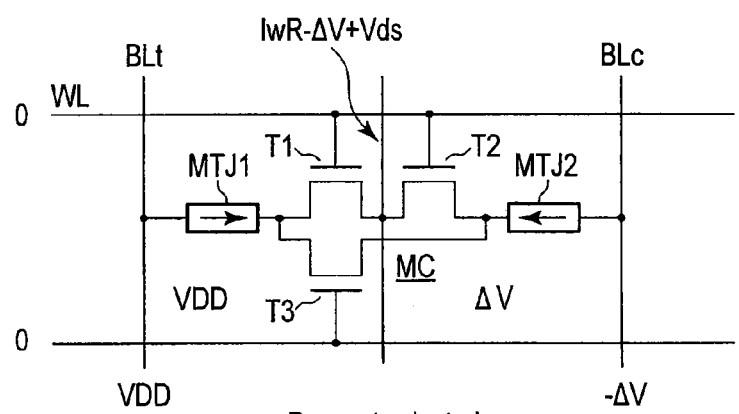
F I G. 16A
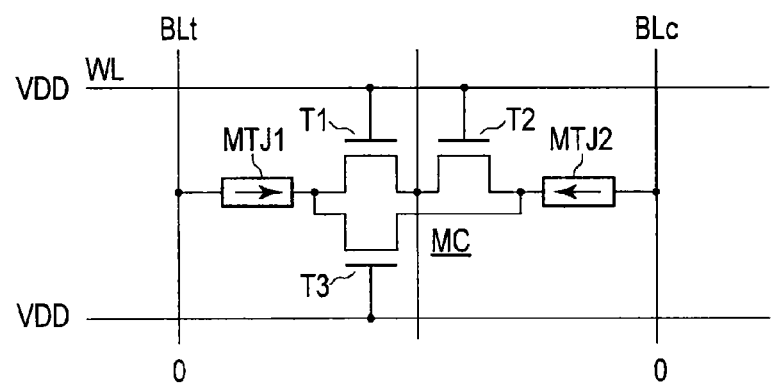
F I G. 16B

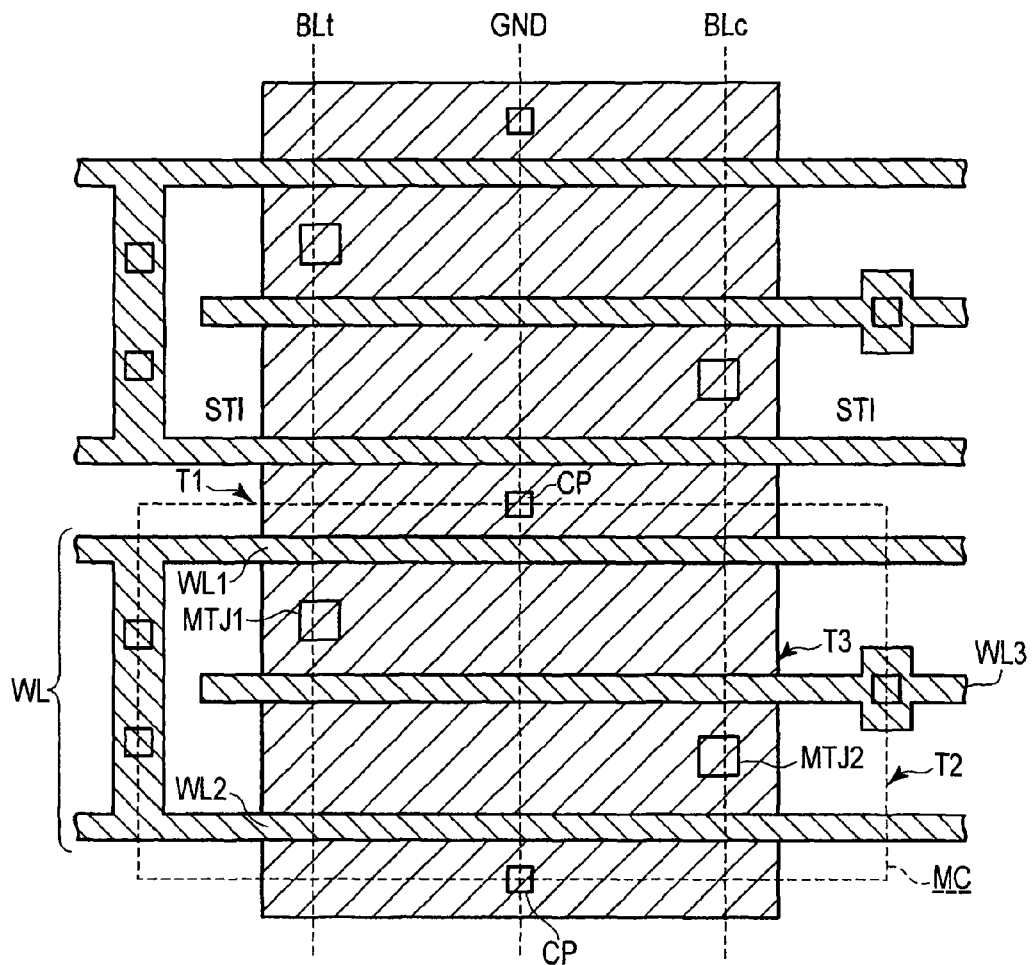
F I G. 17

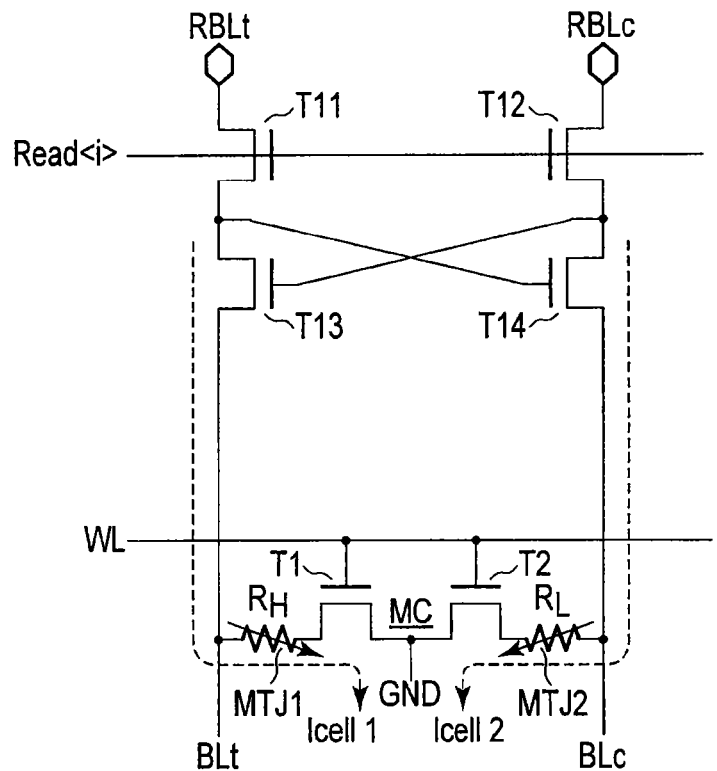
F I G. 18
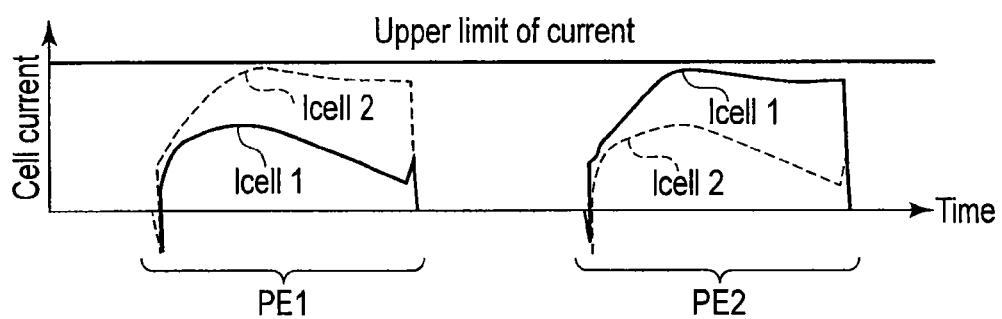
F I G. 19

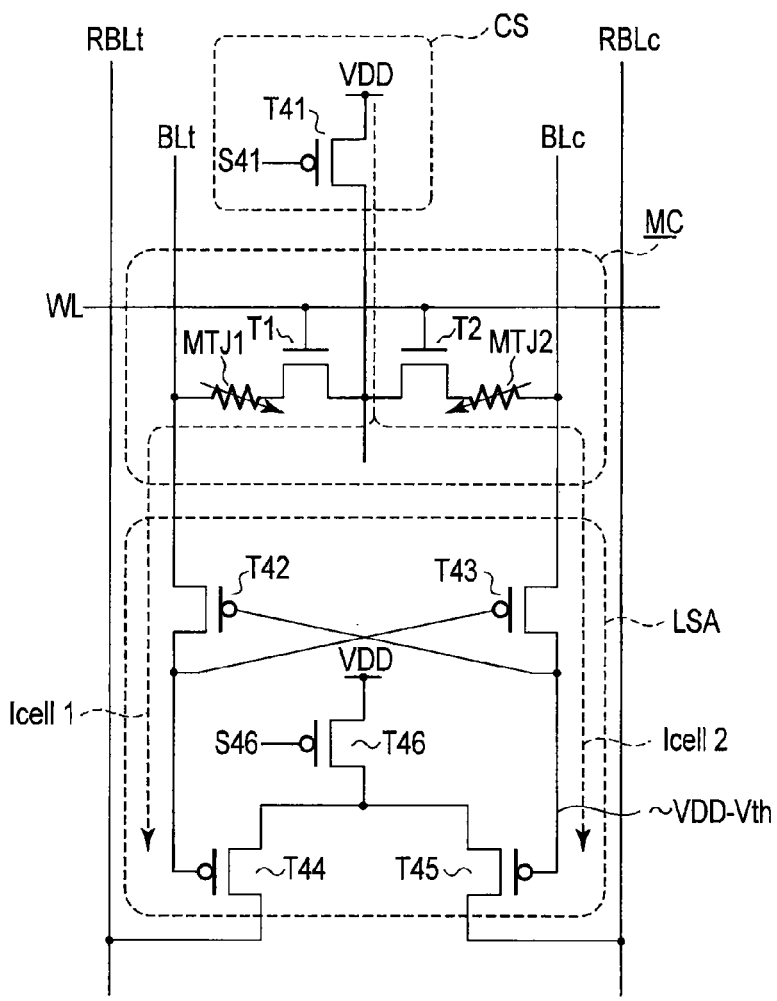
F I G. 20
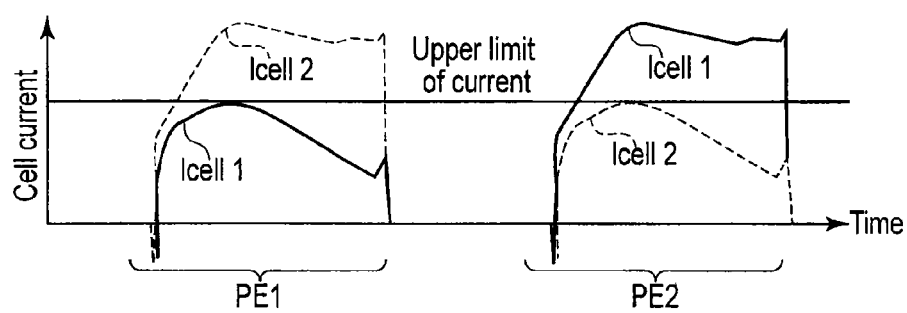
F I G. 21

MAGNETORESISTIVE MEMORY DEVICE WITH REDUCED LEAKAGE AND HIGH SPEED OPERATION IN AN SOC

CROSS-REFERENCE TO RELATED APPLICATIONS

This application is based upon and claims the benefit of priority from Japanese Patent Applications No. 2012-198269, filed Sep. 10, 2012; and No. 2013-177298, filed Aug. 28, 2013, the entire contents of all of which are incorporated herein by reference.

FIELD

Embodiments described herein relate generally to a magnetoresistive memory device, such as a magnetoresistive random access memory (MRAM), from which data is read by using a differential current.

BACKGROUND

In any system on a chip (SoC), a circuit such as cache operates not at all times. If the leakage path is cut while the circuit is not operating, the energy consumption can be reduced because no current leaks.

The static RAM (SRAM) used in the conventional SoC consumes more energy at leakage than in active mode. If the power supply is disconnected to cut the leakage, however, the data stored will be erased. In order to reduce the leak energy, a voltage that would not erase the data may be applied (in retention mode) in some cases. However, the electrostatic capacitance of the SRAM power supply is so large that the leak current may not be reduced even if the power supply is disconnected frequently.

In order to reduce the leak current, it is proposed that an MRAM should be used as nonvolatile memory. The MRAM can, however, hardly operate at high speed if the current flowing to each memory cell is small. This is because data is written in the memory cell when a current flows in the memory cell, and is read from the memory cell by detecting the current flowing in the memory cell. It is therefore desired to provide a magnetoresistive memory in which sufficient current flows in each memory cell and which can therefore operate at high speed.

BRIEF DESCRIPTION OF THE DRAWINGS

FIG. 1 is a circuit diagram showing a read circuit provided in an MRAM of ordinary type;

FIG. 2 is a diagram explaining the operating characteristic of the circuit of FIG. 1;

FIG. 9 is a waveform diagram showing how the circuit of FIG. 8 operates;

FIG. 10 is a circuit diagram explaining the tolerance voltage applied to each cell to write data;

FIG. 15 is a circuit diagram showing the configuration of a memory cell array according to a third embodiment;

FIG. 16A and FIG. 16B are circuit diagrams, each explaining the tolerance voltage applied to write data in the memory cell array according to the third embodiment;

FIG. 17 is a plan view showing the pattern layout of the memory cell array according to the third embodiment;

FIG. 18 is a circuit diagram explaining a cell current applied to read data, according to the first embodiment;

FIG. 19 is a waveform diagram showing the cell current applied to read data, in a circuit shown in FIG. 18;

FIG. 20 is a circuit diagram showing a magnetoresistive memory device according to a fourth embodiment; and FIG. 21 is a waveform diagram showing a cell current applied to read data, according to the fourth embodiment.

DETAILED DESCRIPTION

Figure 3:
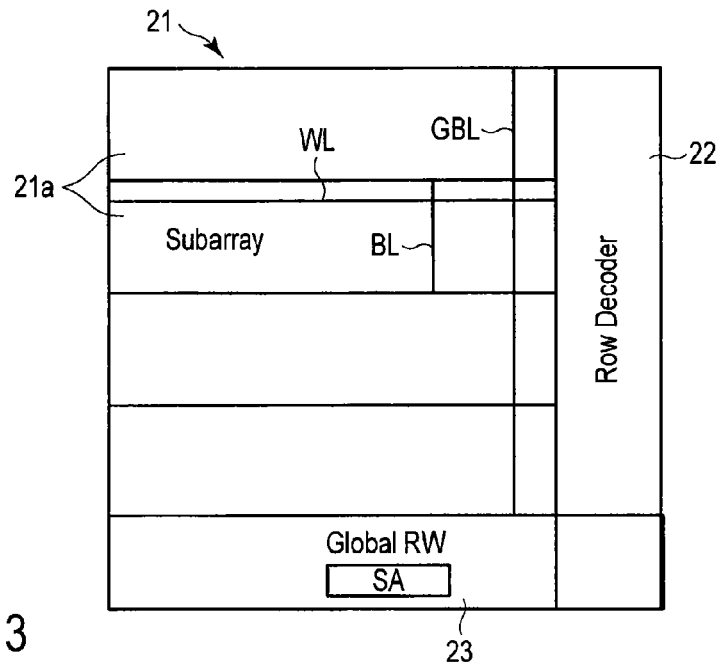
FIG. 3 is a diagram showing a first embodiment, more precisely the configuration of an exemplary memory cell array.

In general, according to one embodiment, a magnetoresistive memory device includes first and second bit lines, a memory cell, third and fourth transistors, and fifth and sixth transistors. The memory cell comprises a first magnetoresistive element and a first transistor serially connected between the first bit line and a first power supply line, and a second magnetoresistive element and a second transistor serially connected between the second bit line and the first power supply line, and gate electrodes of the first and second transistors are connected to a word line. The third and fourth transistors have current paths inserted in the first and second bit lines, and gate electrodes of the third and fourth transistors are connected, respectively, to the second and first bit lines provided on a side opposite to the memory cell. The fifth and sixth transistors are connected to the first and second bit lines of the third and fourth transistors on the side opposite to the memory cell, and are configured to be turned on when data is read from the memory cell.

FIG. 1 shows a read circuit provided in an MRAM of ordinary type. The read circuit is constituted by a sense amplifier 13. The sense amplifier 13 compares the current flowing in a selected memory cell 11 with the current flowing in a reference cell 12, determining which current is larger or small than the other.

In the MRAM, a current equal to or larger than a specific value is supplied to the memory cell 11, thereby writing data in the memory cell 11. To read the data, a current of such a value as would not destroy the data in the memory cell 11 must flow to the memory cell 11. In order to limit this current, a clamp transistor 14 is provided between, and connected to, the selected memory cell 11 and the sense amplifier 13. A clamp transistor 15 is provided between, and connected to, the reference cell 12 and the sense amplifier 13. Since the clamp transistor 14 is provided between the selected memory cell 11 and the sense amplifier 13, the data can be read from the memory cell 11, while prevented from being destroyed.

However, the use of the clamp transistor 14 reduces the current read from the memory cell 11.

As shown in FIG. 2, the difference between the two currents equivalent to data "0" and data "1" stored in the MRAM, respectively, are set to twice the usual value if these data items are approximate to resistances. That is, the resistance equivalent to data "0" is set to R, whereas the resistance equivalent to data "1" is set to 2R. If the same voltage V is applied to the memory cell storing data "0" or data "1," current V/R or V/2R will flows to the memory cell. Thus, the current flowing to the memory cell storing data "0" is twice the current flowing to the memory cell storing data "1".

Nonetheless, a current loss occurs because the clamp transistor 14 is used, which has such current-voltage characteristic as shown in FIG. 2. The current-voltage characteristic shifts the operating point of the clamp transistor 14 as indicated by the arrow. The current difference between the data "0" and the data "1" inevitably decreases to less than twice. As a result, the sense amplifier 13 detects a small current difference, and can no longer operate faster.

Therefore, this embodiment uses magnetic tunnel junction (MTJ) elements as memory cells to perform differential reading, thereby to achieve a high-speed operation.

Moreover, in this embodiment, a part charged at the time of activation and a part discharged are separated. Therefore, a faster transition from a state in which the leakage current has been suppressed to a state in which the memory cells can work, can be obtained and power consumption can be reduced.

Various embodiments will be described with reference to the accompanying drawings. In the drawings, the components of each embodiment, which are identical to those of any other embodiment, are designated by the same reference numbers and symbols.

First Embodiment

FIG. 3 shows the configuration of the memory cell array of a magnetoresistive memory device according to the first embodiment.

The memory cell array 21 is composed of a plurality of sub-arrays 21a. In each sub-array 21a, a plurality of local bit lines BL and a plurality of word lines WL are arranged. The local bit lines BL extend at right angles to the word lines WL. As will be described later, one memory cell is arranged between a pair of local bit lines and is connected to one word line WL. The word line WL may be selected by a row decoder 22.

In parallel to the local bit line BL, a global bit line GBL is arranged. The global bit line GBL extends over a plurality of sub-arrays 21a. The global bit line GBL and the local bit line BL are selectively connected by a transistor, as will be described later. The global bit line GBL is connected to a global read/write circuit 23. The global read/write circuit 23 includes at least a write circuit (not shown) and a sense amplifier SA. The write circuit supplies write data to the global bit line GBL to write data. The sense amplifier detects the current read to the global bit line GBL. As will be described later, each local bit line BL is composed of a pair of bit lines, and each global bit line GBL is composed of a pair of read bit lines and one write bit line.

Figure 4:
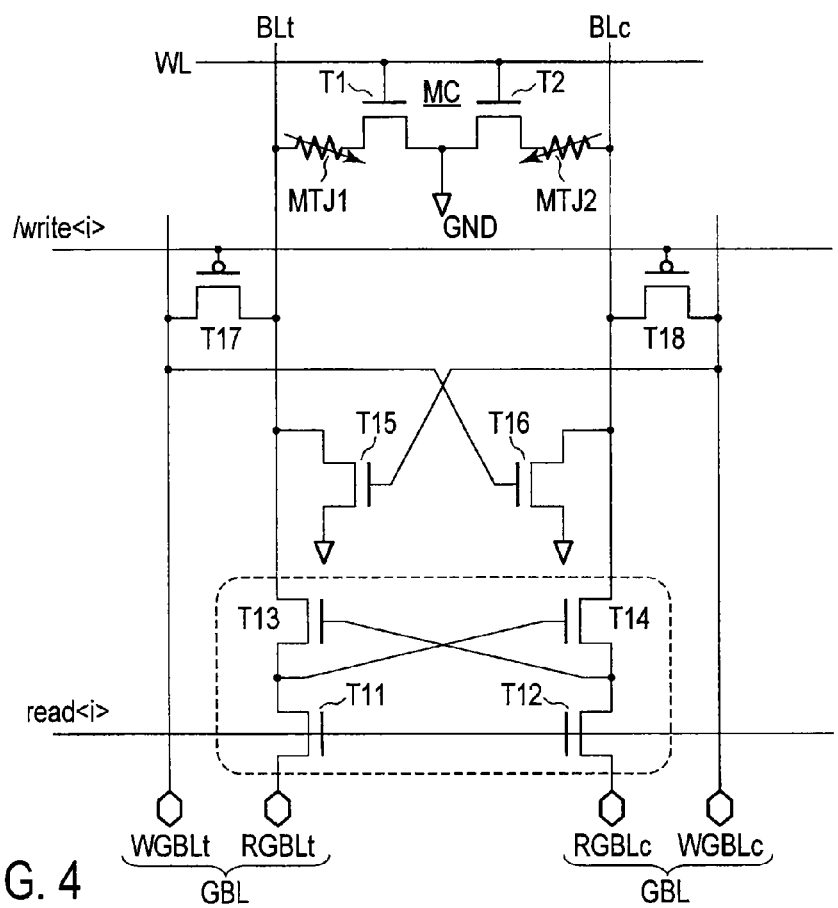
FIG. 4 is a circuit diagram showing a magnetoresistive memory device according to the first embodiment.

FIG. 4 shows the configuration of a part of the memory cell array 21.

First bit line BLt and second bit line BLc correspond to the local bit line BL shown in FIG. 3. A memory cell MC is provided between, and connected to, the first bit line BLt and the bit line BLt.

The memory cell MC is composed of an MTJ 1, an MTJ 2, an N-channel MOS transistor T1, and an N-channel MOS transistor T2. MTJ 1 and MTJ 2 are each composed of a storage layer, a reference layer and an insulating film interposed between the storage layer and the reference layer (not shown). In FIG. 4, MTJ 1 and MTJ 2 are shown as variable resistance elements.

One end (i.e., reference layer) of MTJ 1 is connected to the first bit line BLt, and the other end (i.e., storage layer) of MTJ 1 is connected to one end of the transistor T1. The other end of the transistor T1 is connected to a power supply line GND. One end (i.e., reference layer) of MTJ 2 is connected to the second bit line BLc, and the other end (i.e., storage layer) of the MTJ 2 is connected to one end of the transistor T2. The other end of the transistor T2 is connected, together with the other end of the transistor T1, to the power supply line GND. The gate electrodes of the transistors T1 and T2 are connected to the word line WL. The power supply line is connected to, for exampled, the ground an N-channel MOS transistor (not shown). Nonetheless, the power supply line need not be set to the ground potential. It may be set to any other potential instead.

The first bit line BLt, which is used as a local bit line, is connected to a read global bit line RGBLt via an N-channel MOS transistors T13 and T11 that are connected in series to each other. The second bit line BLc, which is used as a local bit line, is connected to the read global bit line RGBLc via N-channel MOS transistors T14 and T12 that are connected in series to each other.

The gates of the transistors T11 and T12 receive a signal read<i>. The signal read<i> is activated by a column address to read data. In response to the signal read<i>, the transistors T11 and T12 connect the first bit line BLt and second bit line BLc, which are use as local bit lines, to the read global bit lines RGBLt and RGBLc, respectively.

The gate electrode of the transistor T13 is connected to the connection node of the transistors T14 and T12. The gate electrode of the transistor T14 is connected to the connection node of the transistors T13 and T11. That is, the transistors T13 and the transistor T14 are cross-coupled to each other.

An N-channel MOS transistor T15 is connected between the ground and the first bit line BLt which extends between the transistor T13 and the memory cell MC. Further, an N-channel MOS transistor T16 is connected between the ground and the second bit line BLc which extends between the transistor T14 and the memory cell MC. The gate electrode of the transistor T15 is connected to a write global bit line WGBLc. The gate of the transistor T16 is connected to a write global bit line WGBLt.

The first bit line BLt is connected to the write global bit line WGBLt via a P-channel MOS transistor T17. The second bit line BLc is connected to the write global bit line WGBLc via a P-channel MOS transistor T18. The gates of these transistors T17 and T18 receive a signal/Write<i>. This signal/Write<i> is activated by a column address to write data.

(Write Operation)

First, the signal/write<i> and the word line W1 are set to low level and high level, respectively, and the signal read<i> is set to low level, in order to write data in the configuration described above.

When the signal/write<i> is set to low level, the transistors T17 and T18 are turned on. Then, the first bit line BLt and the second bit line BLc are set to high level and low level, respectively, if the data on the write global bit line WGBLt is "1" (high level) and the data on the write global bit line WGBLc is "0" (low level). As the word line WL is set to high level, the transistors T1 and T2 are turned on. As a result, current flows from the first bit line BLt to the second bit line BLc via the memory cell MC.

The data on the write global bit line WGBLt and the data on the write global bit line WGBLc turn the transistor T16 on, and the transistor T15 off. The transistor T16, now turned on, sets the second bit line BLc to the ground potential, though the second bit line BLc is not set to the ground potential because of its threshold voltage since both the write global bit line WGBLc and the second bit line BLc are connected by a P-channel MOS transistor. Thus, data "1" is set to MTJ 1, and data "0" to MTJ 2.

Assume that the data on the write global bit line WGBLt is "0" (low level), and that the data on the write global bit line WGBLc is "1" (high level). Then, the first bit line BLt is set to low level, and the second bit line BLc is set to high level.

The data on the global bit line WGBLt and the data on the global bit line WGBLc turn the transistor T15 on, and the transistor T16 off. The transistor T15, now on, sets the first bit line BLt to the ground potential. As a result, data "1" is set to MTJ 2, and data "0" is set to MTJ 1.

(Read Operation)

First, the signal read<i> is set to high level, and the word line WL is set to high level. Further, the signal/write<i> is set to high level.

Both the read global bit line RGBLt and the global bit line RGBLc are pre-charged to high level.

When the signal read<i> is set to high level, the transistors T11 and T12 are turned on, and the transistors T13 and T14, which are cross-coupled to each other, are also turned on. An electrical charge is therefore transferred from the read global bit lines RGBLt and RGBLc to the first and second bit lines BLt and BLc, respectively.

Since the word line WL is at high level, the transistors T1 and T2 of the memory cell MC are turned on. Assume that MTJ 1 and MTJ 2 data "0" and data "1" are held in MTJ 1 and MTJ 2, respectively. Then, the resistance of MJT 2 is almost twice the resistance of MTJ 1. Hence, the current flowing between MTJ 1 having low resistance and the power supply line GND becomes larger than the current flowing between MTJ 2 and the ground. That is, the current flowing via MTJ 1 to the first bit line BLt is twice as much as the current flowing via MTJ 2 to the second bit line BLc.

A current, which is a difference between the currents flowing in the first and second bit lines BLt and BLc, flows to the read global bit lines RGBLt and RGBLc connected to the first and second bit lines BLt and BLc via the transistors T11 and T12, respectively. The sense amplifier SA, which is connected to the read global bit lines RGBLt and RGBLc, detects the difference between the currents flowing, respectively, in the read global bit lines RGBLt and RGBLc.

Figure 5:
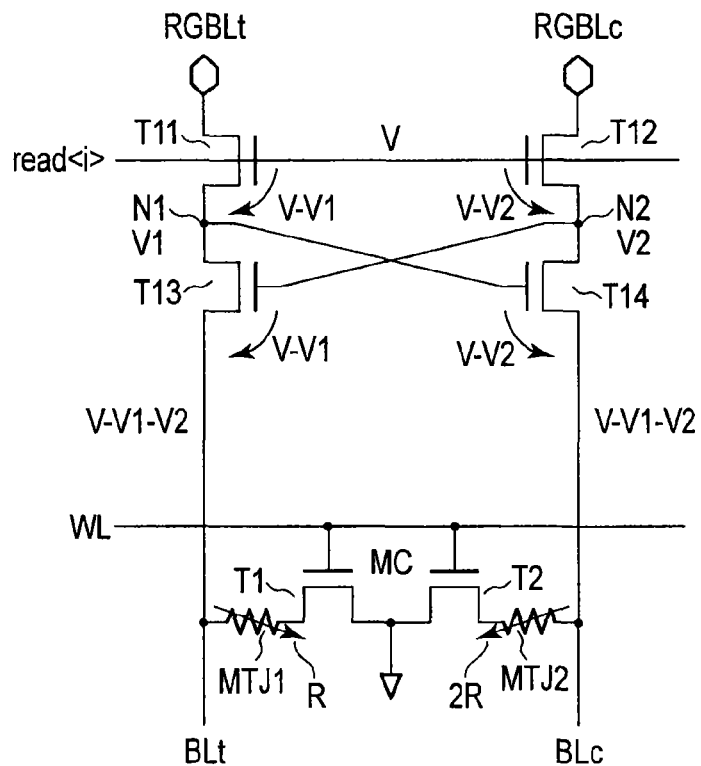
FIG. 5 is a diagram explaining how the memory cell array of FIG. 4 operates to read data.

FIG. 5 explains how the transistors T11 to T14 operate in order to read data.

To read data, the global bit lines WGBLt and WGBLc are equalized to voltage V. If the voltage of the signal read<i> is set to V in this state, the transistors T11 to T14 operate in saturated region. Assume that the connection node N1 of the transistors T11 and T13 is at voltage V1, and that the connection node N2 of the transistors T12 and T14 is at voltage V2. Then, the gate-source voltage Vgs of the transistor T11 is V−V1 (Vgs=V−V1), and the gate-source voltage Vgs of the transistor T12 is V−V2 (Vgs=V−V2). Further, the source voltage Vs of the transistor T13 is V−V2−V1, and the source voltage Vs of the transistor T14 is also V−V2−V1. The potential difference between the first and second bit lines BLt and BLc can therefore be zero at the time of reading data. Hence, the difference between the currents flowing, respectively, in the first and second bit lines BLt and BLc can be reliably transferred to the global bit lines WGBLt and WGBLc.

Moreover, MTJ 1 and MTJ 2 are prevented from assuming a data-written state because the potential difference between the first and second bit lines BLt and BLc is zero. This can prevent the data in MTJ 1 and MTJ 2 from being destroyed.

Figure 6:
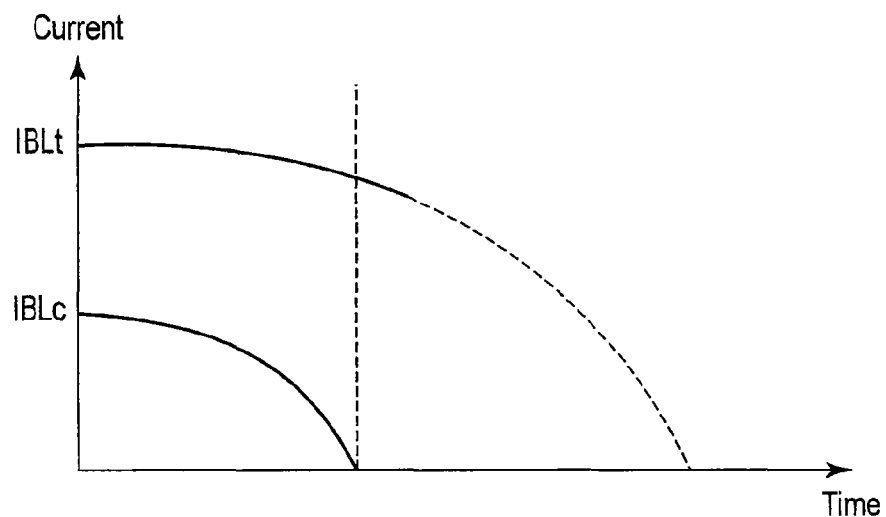
FIG. 6 is a diagram showing how the current changes when data is read from the memory cell array shown in FIG. 4.

FIG. 6 shows how the currents flow in the first and second bit lines BLt and BLc, respectively. Assume that MTJ 1 and MTJ 2 have resistance R and resistance 2R, respectively. Then, if the transistors T1 and T2 are turned on, a current twice as much as the current flowing in the second bit line BLc will flow to the first bit line BLt via the MTJ 1. If the potential at the connection node N1 falls thereafter, cutting off the transistor T14, the current flowing in the second bit line BLc will be zero.

Once the transistor T14 has been cut off, the potential at the connection node N2 remains at high level. The transistor T13 is therefore maintained in on-state, and current flows in the first bit line BLt. The ratio of the current flowing in the first bit line BLt to the current flowing in the second bit line BLc (or difference between these currents) can therefore be increased, and the sense amplifier can reliably detect the data stored in the memory cell.

Further, since the transistors T13 and T14 are controlled by, respectively, the potential at the connection node N2 and the potential at the connection node N1, the ratio of the current flowing in the first bit line BLt to the current flowing in the second bit line BLc can be determined at high speed. That is, the sense amplifier can perform its function at high speed.

According to the first embodiment, the transistors T13 and T14 are cross-coupled to each other, the transistor T13 is controlled by the potential at the connection node N2, and the transistor T14 is controlled by the potential at the connection node N1. Therefore, the time for cutting off the transistor connected to the small-current side can be shortened. As a result, the ratio of the currents between the first bit line BLt and the second bit line BLc can be determined at high speed. This enables the sense amplifier to operate a higher speed.

In addition, the transistors T13 and T14, which are cross-coupled to each other, can reduce the potential difference between the first and second bit lines BLt and BLc to zero. The current difference between the first and second bit lines BLt and BLc, which achieve differential reading, can therefore be correctly transferred to the read global bit lines RGBLt and RGBLc.

The first and second bit lines BLt and BLc and the read global bit lines RGBLt and RGBLc are selectively connected by the transistors T11 and T12. The transistors T11 and T12 can therefore isolate the first and second bit lines BLt and BLc from the read global bit lines RGBLt and RGBLc, respectively, ultimately raising the state transition speed.

Since an MRAM is used as memory cell, not using any clamp circuit, thereby decreasing the current loss. The power consumption can, therefore, be reduced.

The local bit lines are connected to read global bit lit lines, in one-to-one correspondence. The connection is not limited to this. A plurality of local bit lines may be connected to one read global bit line. In this case, the number of sense amplifiers required can be decreased.

Second Embodiment

Figure 7:
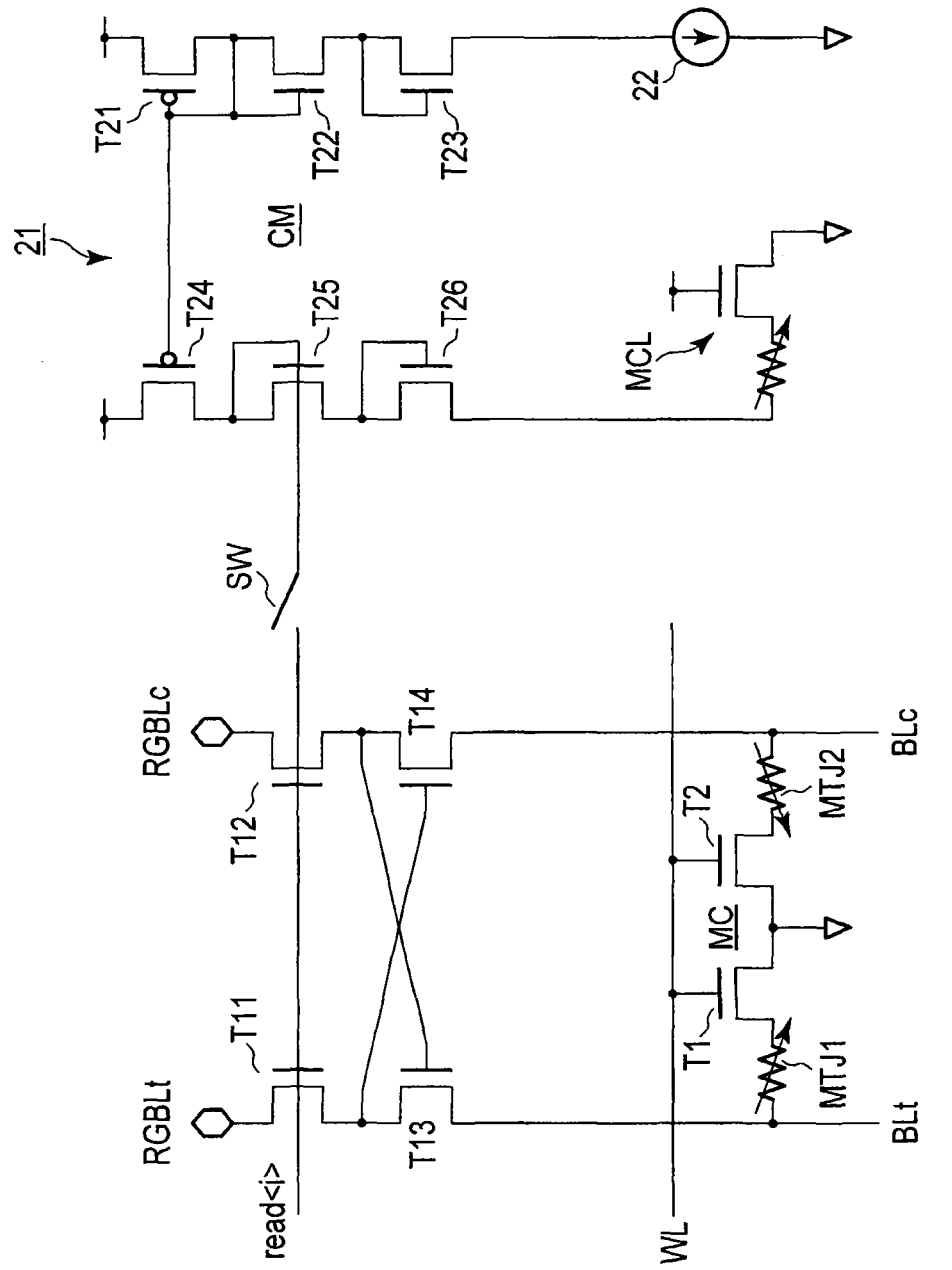
FIG. 7 is a circuit diagram showing a second embodiment.

FIG. 7 shows a second embodiment.

As described above, the currents flowing in the first and second bit lines BLt and BLc must be limited during the differential reading, in order to prevent the destruction of the data stored in the memory cell MC.

The transistors may have greater current-driven ability than designed because of the manufacture process conditions or the temperature ambient to the transistors may be relatively high.

In either case, the bias voltages applied to the transistors T11 and T12 can be controlled, thereby to control the currents flowing in the first and second bit lines BLt and BLc.

In view of this, the gate biases of the transistors T11 and T12 can be controlled in the second embodiment.

As shown in FIG. 7, a bias circuit 21 is connected to the gate electrodes of the transistors T11 and T12 via a switch SW. The bias circuit 21 comprises a current mirror circuit CM. The current mirror circuit CM is composed of a P-channel MOS transistor T21, N-channel MOS transistors T22 and T23, a constant current source 22, a P-channel MOS transistor T24, N-channel MOS transistors T25 and T26, and a memory cell MCL. The P-channel MOS transistor T21 and N-channel MOS transistors T22 and T23, and the constant current source 22 are connected in series between the power supply and the ground. The P-channel MOS transistor T24, N-channel MOS transistors T25 and T26, and the memory cell MCL are connected in series between the power supply and the ground.

The memory cell MCL is a replica of the memory cell MC. The N-channel MOS transistors T22, T23, T25 and T26 are replicas of the transistors T11 to T14.

The gate electrodes of the P-channel transistors T21 and T24 are connected to each other, and is connected to the gate electrode of the transistor 22 and the connection node of the transistors T21 and T22. The gate electrode of the transistor T23 is connected to the connection node of the transistor T22 and T23.

The gate electrode of the transistor T25 (i.e., the output terminal of the current mirror circuit) is connected to the connection node of the transistors T24 and T25, and is connected via the switch SW to the gate electrodes of the transistors T11 and T12. The gate electrode of the transistor T26 is connected to the connection node of the transistors T25 and T26.

In the configuration described above, the switch SW is turned on when data is read and the bias circuit 21 is connected to the gate electrodes of the transistors T11 and T12. In this state, the current flowing in the constant current source 22 is mirrored to the memory cell MCL. The voltage based on the current supplied from the constant current source 22 is therefore applied to the gate electrodes of the transistors T11 and T12. As a result, the gate voltages of the transistors T11 and T12 are thereby held at a constant value.

According to the second embodiment, the gate voltages of the transistors T11 and T12 are controlled by the bias circuit 21 comprises a replica circuit composed of transistors T11 to T14, a replica circuit of the memory cell MC, and a current mirror circuit including the constant current source 22. Hence, even if the transistors have greater current-driven ability than designed because of the manufacture process conditions or the temperature ambient to the transistors is relatively high, an excessively large current is prevented from flowing to the first and second bit lines BLt and BLc, merely by controlling the gate voltages of the transistors T11 and T12. This prevents the data stored in the memory cell MC from being destroyed as it is read from the memory cell MC.
(Modification)

Figure 8:
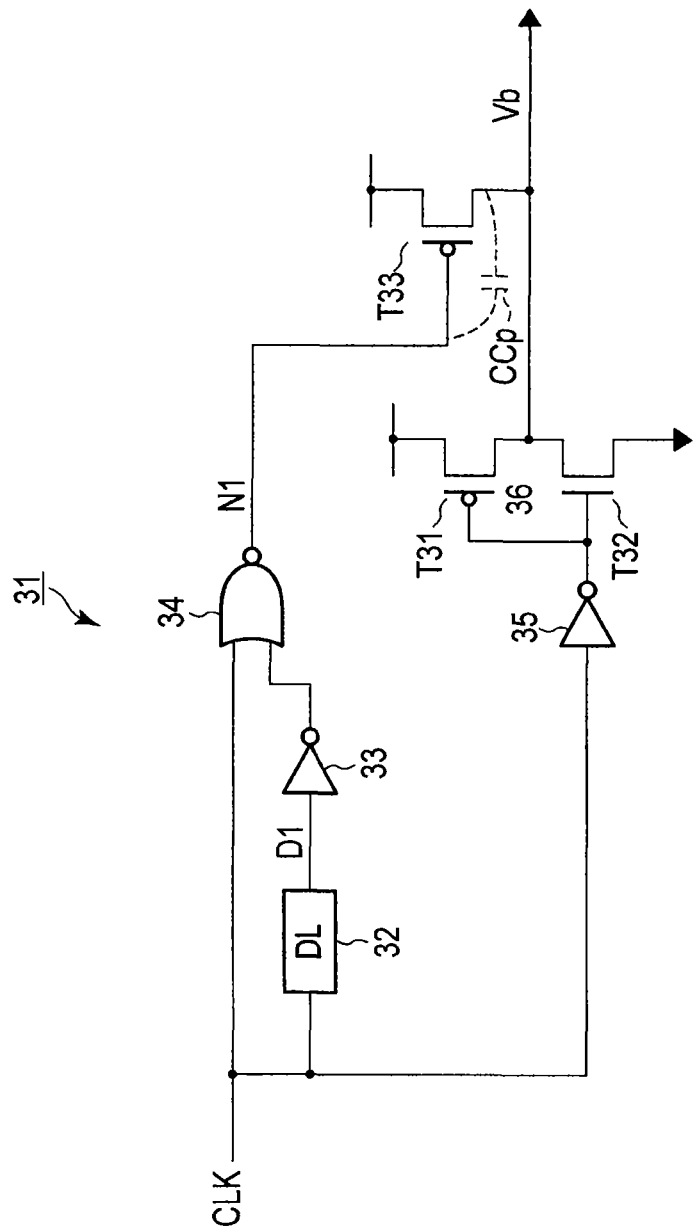
FIG. 8 is a circuit diagram showing a modification of the second embodiment.

FIG. 8 shows a modification of the second embodiment.

It has been explained how the second embodiment operates if the transistors have greater current-driven ability than designed. The second embodiment is designed to operate well if the transistors have smaller current-driven ability than designed.

FIG. 8 shows a bias circuit 31. In the bias circuit 81, a clock signal CLK synchronous with the input of, for example, a column address is delayed by a delay circuit (DL) 32, inverted by an inverter circuit 33 and is input to one input terminal of a NOR circuit 34. The clock signal CLK is supplied to the other input terminal of the NOR circuit 34.

The clock signal CLK is also supplied via an inverter circuit 35 to the gate electrodes of P-channel MOS transistor T31 and N-channel MOS transistor T32, which constitute an inverter circuit 36. The transistors T31 and T32 are connected in series between the power supply and the ground. The connection node of these transistors T31 and T32 is connected to the gate electrodes of the transistors T11 and T12 mentioned above.

Further, a P-channel MOS transistor T33 is provided between, and connected to, the power supply and the connection node of the transistors T31 and T32. This transistor T33 receives, at gate electrode, the output signal of the NOR circuit 34.

How the bias circuit 31 of FIG. 8 operates will be explained with reference to FIG. 9.

As FIG. 9 shows, if a clock signal CLK is supplied to the bias circuit 31, the delay circuit 32, inverter circuit 33 and NOR circuit 34 generate cooperate, generating a signal N1 at the falling edge of the clock signal CLK. The signal N1 is supplied to the gate electrode of the transistor T33. Using the signal N1, the coupling capacitor Cap provided between the gate and drain of the transistor T33 boosts the output voltage Vb of the inverter circuit 36 to a level higher than the level of the clock signal CLK. The output voltage Vb, thus boosted, is applied to the gate electrodes of the transistors T11 and T12, enhancing the current-driven ability of the transistors T11 and T12. The currents flowing in the first and second bit lines BLt and BLc can thereby be transferred reliably to the read global bit lines RGBLt and BLc.

In the modification described above, the bias circuit 31 boosts the gate biases of the transistors T11 and T12. The current-driven ability of the transistors T11 and T12, which may be lower than designed, can therefore be enhanced. As a result, the currents flowing in the first and second bit lines BLt and BLc can be reliably transferred to the read global bit lines RGBLt and RGBLc.
(Tolerance Voltage of the Cell at Data Writing)

The tolerance voltage the cell has at data writing will be explained with referenced to FIG. 10.

As specified above, two transistors T11 and T2 and two MTJ 1 and MTJ2 are provided in the write path to write data in the memory cell MC provided between, and connected to, the first bit line BLt and the second bit line BLc. To provide a sufficient write current, the low-level potentials of the first and second bit lines BLt and BLc set to negative voltages. The transistors T1 and T2 can be reliable if MTJ 1 and MTJ 2 undergo a voltage drop (IR drop). The bias the transistors T1 and T2 need to acquire reliability is given as follows:

$$Vwl - IwR + \Delta V < Vtol \qquad (1)$$

where Vwl is the level to which the word line WL is set when the word line WL is selected, Iw is the current flowing in the memory cell MC, R is the resistance of MTJ 2, ΔV is the absolute value of the negative voltage, and Vtol is the tolerance voltage of the transistors.

In the cell selected, which is shown in FIG. 10, the source potential of the transistor T2 has a positive value as shown in the following formula (2):

$$IwR-\Delta V(>0) \tag{2}$$

This positive value satisfies the relation of the formula (1), ensuring the reliability of the cell selected.

Figure 11A:
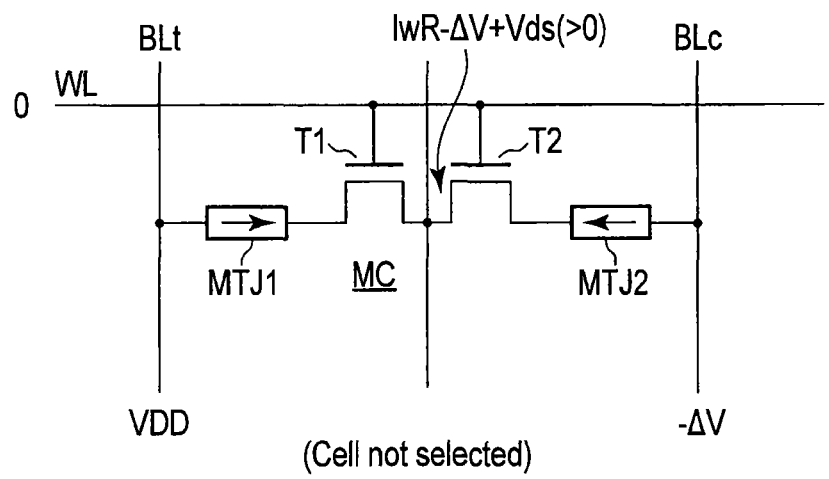
FIG. 11A and FIG. 11B are circuit diagrams, each explaining the tolerance voltage applied to any other cell to write data.

FIG. 11A shows a memory cell connected to a non-selected row and a selected column. In the circuit of FIG. 11A, the connection node of the transistors T1 and T2 is at a positive potential, as shown in the following formula (3):

$$IwR-\Delta V+Vds(>0) \tag{3}$$

This satisfies the relation of the formula (1), ensuring the reliability of the cell selected.

Figure 11B:
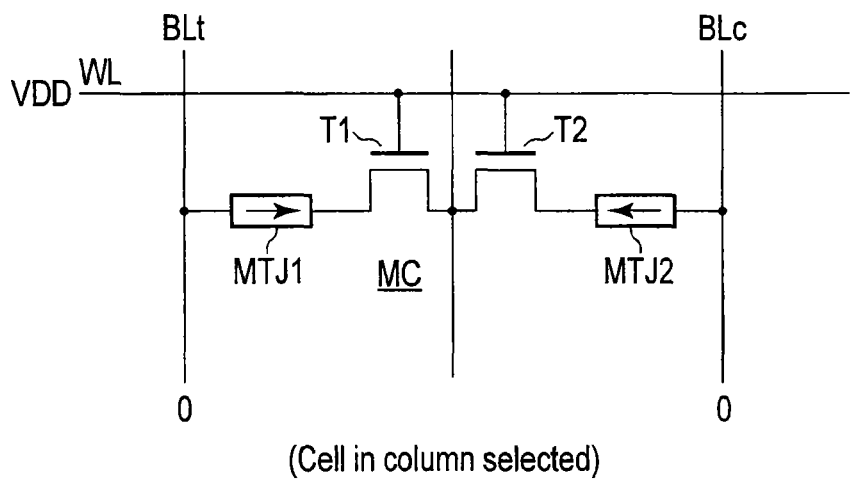

FIG. 11B shows a memory cell connected to a selected row and a non-selected column. This cell has, of course, reliability.

Thus, in the memory cell array used in the first and second embodiments, each cell has a sufficient tolerance voltage at the data writing.

(Pattern Layout of the Memory Cell Array)

Figure 12:
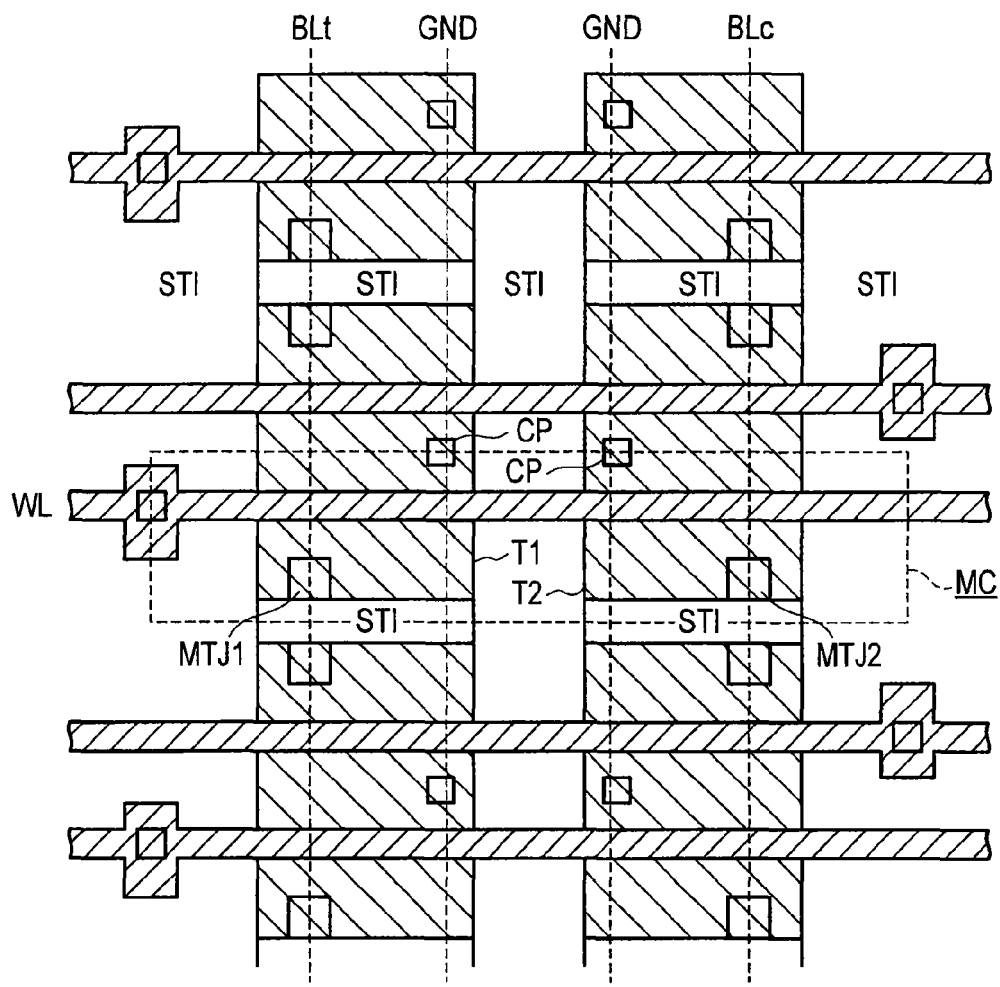
FIG. 12 is a plan view showing an exemplary pattern layout of a memory cell array applied to the first and second embodiments.
Figure 13:
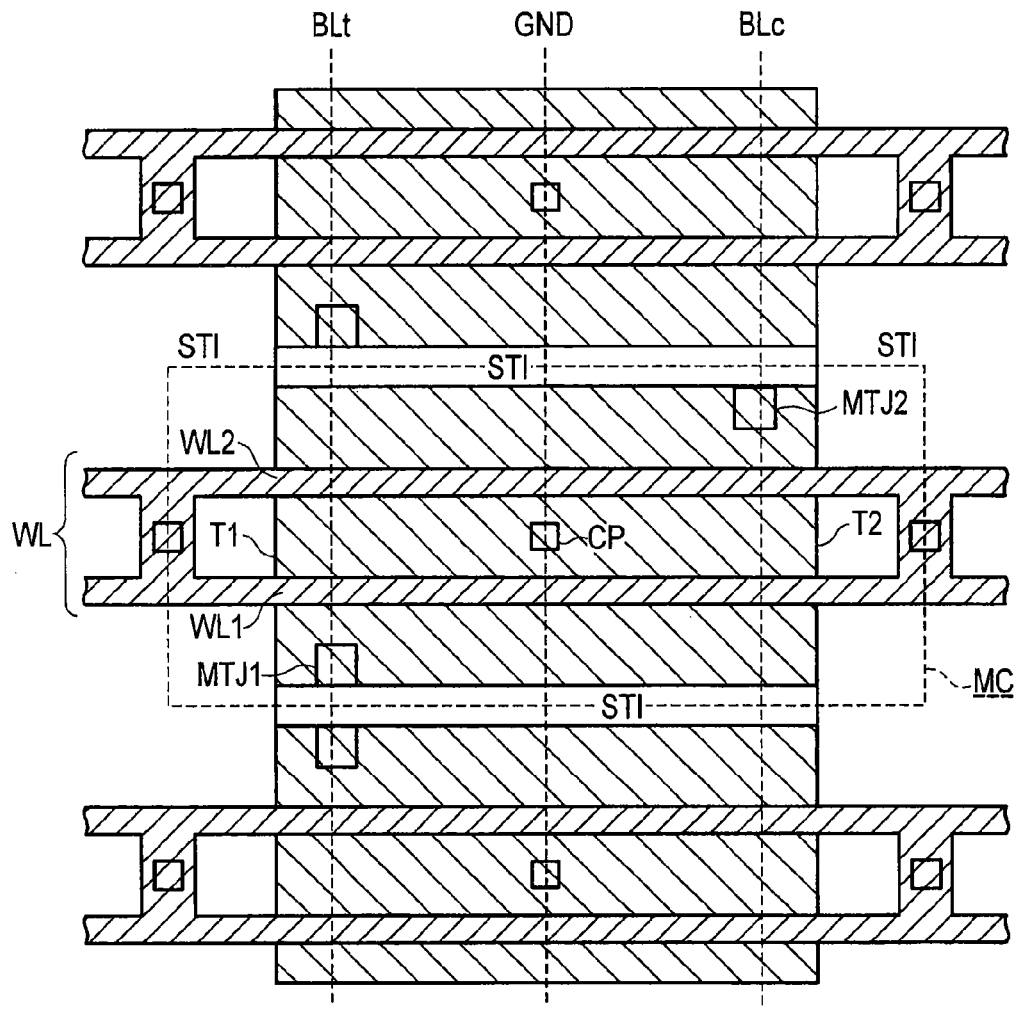
FIG. 13 is a plan view showing another exemplary pattern layout of the memory cell array applied to the first and second embodiments.
Figure 14:
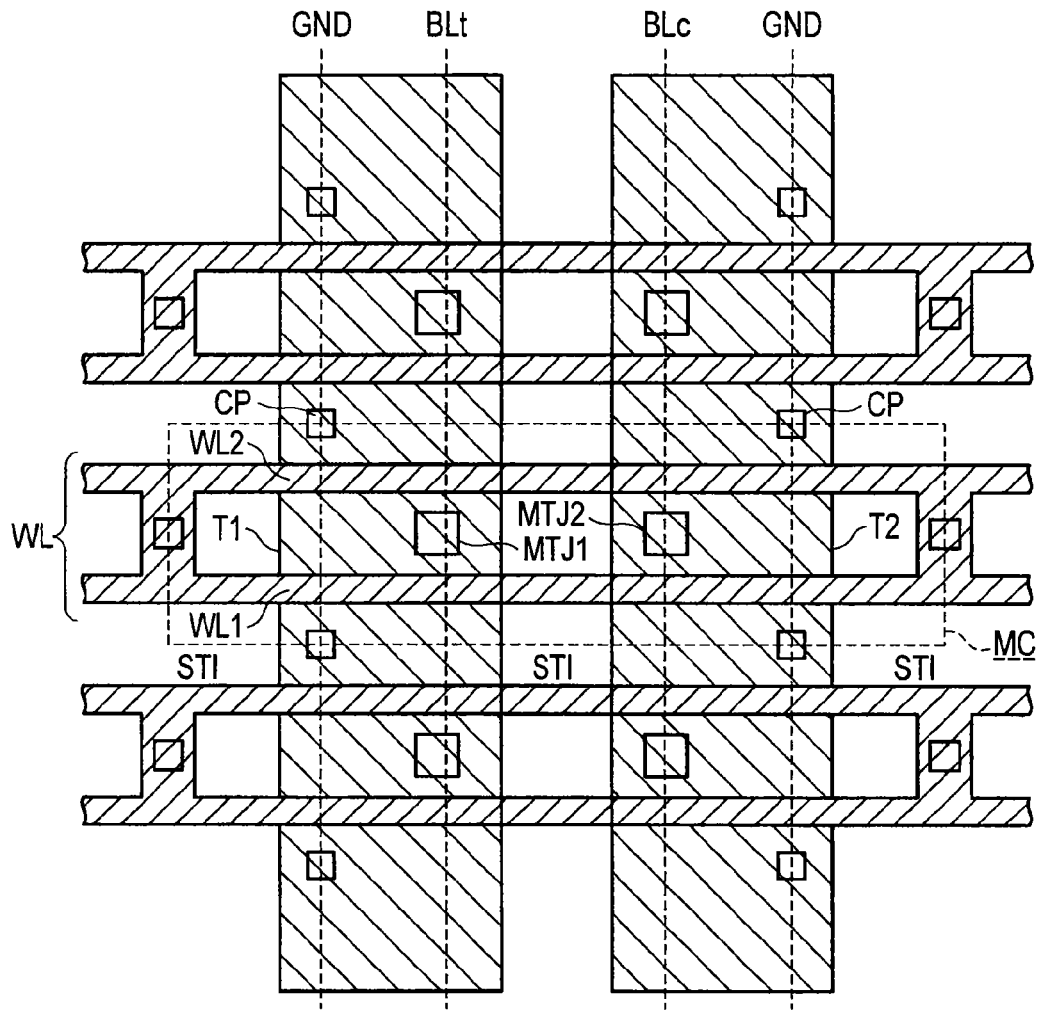
FIG. 14 is a plan view showing still another exemplary pattern layout of the memory cell array applied to the first and second embodiments.

FIG. 12, FIG. 13 and FIG. 14 show two pattern layouts which may be applied to the memory cell arrays according to the first and second embodiments.

In the pattern of FIG. 12, the transistors T1 and T2 constituting the memory cell MC share a word line WL used as gate electrode. Between the transistors T1 and T2 arranged in the row direction, an element isolation region ST1 is provided. Between the transistors T1 and T2 arranged in the column direction, too, an element isolation region ST1 is provided. Thus, the transistors T1 and T2, which are two transistors adjacent in the column direction, share a source-drain region.

On one part of the source-drain region common to the transistors T1 and T2, MTJ 1 and MTJ 2 are provided. MTJ 1 and MTJ 2 are connected to bit lines BLt and BLc, respectively. MTJ 1 and MTJ 2 are arranged on one side of a word line WL. The source-drain region common to the transistors T1 and T2 is connected, at the other side, to a power supply line GND. This layout pattern has two power supply lines GND, each having a contact CP. The contacts PC are arranged on the other side of the word line WL.

In the pattern of FIG. 13, the transistors T1 and T2 constituting the memory cell MC share a word line WL used as gate electrode. The word line WL has first and second parts WL1 and WL2. Between the transistors T1 and T2 arranged in the column direction, an element isolation region ST1 is provided.

On one part of the source-drain region common to the transistors T1 and T2, MTJ 1 and MTJ 2 are provided. MTJ 1 and MTJ 2 are connected to bit lines BLt and BLc, respectively, and are arranged on the sides of the word line WL, respectively. The other part of the source-drain region of the transistor T1 and T2 is arranged between the first and second parts WL1 and WL2 of the word line WL, and is shared by the transistors T1 and T2. On the other part of the source-drain region, the contact CP of the power supply line GND is arranged. This pattern has one power supply line GND.

In the pattern of FIG. 14, the transistors T1 and T2 constituting the memory cell MC shares a word line WL used as gate electrode. The word line WL has first and second parts WL1 and WL2. Between the transistors T1 and T2 arranged in the row direction, an element isolation region ST1 is provided.

On one part of the source-drain region common to the transistors T1 and T2, MTJ 1 and MTJ 2 are provided. MTJ 1 and MTJ 2 are connected to bit lines BLt and BLc, respectively, and are arranged between the first and second parts WL1 and WL2 of the word line WL. On the other part of the source-drain region of the transistors T1 and T2, the contact CP of the power supply line GND is arranged. This pattern has two power supply lines GND.

The pattern layout of the memory cell array is not limited to those shown in FIG. 12, FIG. 13 and FIG. 14. The memory cell arrays according to the first and second embodiments may have any other appropriate pattern layout.

Third Embodiment

FIG. 15 shows the configuration of a memory cell array according to a third embodiment.

In a high-speed memory capable of performing differential reading, a memory cell MC is provided between, and connection to, first and second bit lines BLt and BLc, as described above. Since two MTJs are used in it, the memory device may consume more power than otherwise. If serial writing is performed on two MTJs, a sufficiently high voltage can hardly be applied across each MTJ in some cases, inevitably because of the IR drop in the MTJ. Consequently, it may become difficult to acquire a write current of Iw or more. The transistors T1 and T2 constituting the memory cell should better be thin-film transistors, for the purpose of reducing the sell size. Hence, the voltage VDD on the word line WL cannot be raised.

In view of this, a write transistor is connected to the memory cell MC in the, third embodiment, thereby mitigating the influence of the IR drop at the time of writing data.

More specifically, a write transistor T3 is connected in parallel to the transistors T1 and T2 as shown in FIG. 15. A high-level signal is supplied to the gate electrode of the write transistor T3 and to the word line WL, in order to write data. The write transistor T3 is therefore turned on or off, at the same time the transistors T1 and T2 are turned on or off.

The use of the write transistor T3 can reduce the IR drop at the time of writing data. Reliability can therefore be ensured in writing data in any selected cell.

In a cell of a selected column, i.e., one of the cells constituting a non-selected row, a potential higher than the potential at the transistors T1 and T2 is applied, as shown in FIG. 16A, to the source-drain path of the write transistor T3. Nonetheless, the write transistor T3 is off, and the memory device is free from hot carrier injection (HCI) or negative bias temperature instability (NBTI). The memory device is thus prevented from degrading in reliability.

Also in a cell of a non-selected column shown in FIG. 16B, i.e., one of the cells constituting a selected row, the transistor T3 would not degrade in terms of tolerance voltage.

FIG. 17 shows the pattern layout of the memory cell array according to the third embodiment. As seen from FIG. 17, the write transistor T3 shares a source-drain region with the transistors T1 and T2. The gate electrode WL3 of the transistor T3 is arranged between the first part WL1 and second part WL2 of the word line WL. The pattern layout of the memory cell array is not limited to the pattern layout of FIG. 17. It may be changed, as needed.

According to the third embodiment, the write transistor T3 is connected in parallel to the transistors T1 and T2 that constitute the memory cell MC. To write data, not only the transistors T1 and T2, but also the transistor T3 is turned on. Therefore, the IR drop is reduced at the time of writing data, enhancing the reliability of data writing.

Since the write transistor T3 is used, the memory cell array has more transistors than in the first and second embodiments. However, the third embodiment can has a far larger write margin than the first and second embodiments.

To write data, only the transistor T3 may be selected, not selecting the transistor T1 or the transistor T2. In this case, the energy for selecting the word line WL can be reduced, and the line delay can be more decreased than in the first and second embodiments. As a result, the memory device of the third embodiment can perform high-speed data writing.

Fourth Embodiment

FIG. 18 shows an operation of reading data in the circuit shown in FIG. 4. In FIG. 18, the same portions as those in FIG. 4 are designated by the same reference numbers and symbols.

As described above, when data of a memory cell MC is read in FIG. 18, global bit lines GBLt and GBLc, and a first bit line BLt and a second bit line BLc which are local bit lines are charged, and a word line is activated. For this reason, currents flow from the first bit line BLt and the second bit line BLc, respectively, to the ground, in the selected memory cell MC. That is, a current (i.e., cell current) Icell1 flowing to MTJ1 flows from a reference layer side to a storage layer side in the MTJ1, and the current (i.e., cell current) Icell2 flowing to MTJ2 flows from a reference layer side to a storage layer sides in the MTJ2.

For example, if a resistance of MTJ1 is higher than a resistance of MTJ2, the current Icell2 flowing to MTJ2 is greater than the current Icell1 flowing to MTJ1 as indicated by PE1 in FIG. 19. In addition, if the resistances of MTJ1 and MTJ2 have an opposite relationship, the current Icell1 flowing to MTJ1 is greater than the current Icell2 flowing to MTJ2 as indicated by PE2 in FIG. 19.

However, if the current flows from the reference layer to the storage layer as shown in FIG. 18, Read Disturb, which destroys stored data, occurs in data of MTJ having low resistance. For this reason, increasing the amount in read current is difficult.

In view of this, in the fourth embodiment, the current to flow to the memory cell MC when the data is read flows in a direction opposite to the direction shown in FIG. 18. Thereby, Read Disturb rarely occurs in MTJ having low resistance. Therefore, a read current can be increased and a read operation can be accelerated.

FIG. 20 shows a magnetoresistive memory device according to the fourth embodiment. The same portions as those in FIG. 4 are designated by the same reference numbers and symbols, and different portions alone are described.

In FIG. 20, a current source CS is connected to the memory cell MC. The memory cell MC is composed of, for example, a P-channel MOS transistor T41. A current path of the transistor T41 is connected between a supply node of a power supply VDD and a connection node of transistors T1 and T2. A signal S41 is supplied to a gate electrode of the transistor T41. The signal S41 has a voltage of, for example, 0V or higher when the current flows, and controls an upper limit of the current flowing to the memory cell MC when the data is read.

In addition, a local sense amplifier LSA is connected between the first bit line BLt and the second bit line BLc, and the global bit lines RBLt and RBLc. The local sense amplifier LSA is composed of P-channel MOS transistors T42, T43, T44, T45 and T46. A current path of the transistor T42 is inserted into and connected to the first bit line BLt. A current path of the transistor T43 is inserted into and connected to the second bit line BLc. Gate electrodes of the transistors T42 and T43 are connected, respectively, to the second bit line BLc and the first bit line BLt on a side opposite to the memory cell MC. That is, the transistors T42 and T43 are cross-coupled to each other.

The first bit line BLt is connected to a gate electrode of the transistor T44. The second bit line BLc is connected to a gate electrode of the transistor T45. One ends of current paths of the transistors T44 and T45 are connected to each other. The other end of the current path of the transistor T44 is connected to the global bit line RBLt. The other end of the current path of the transistor T45 is connected to the global bit line RBLc.

The transistor T46 is connected between a connection node of the transistors T44 and T45 and the supply node of the power supply VDD. A signal S46 is supplied to a gate electrode of the transistor T46. The signal S46 is set at a low level when the data is read from the memory cell MC, and is generally set at a high level.

The operation of reading the data from the memory cell MC in the above-described configuration will be hereinafter described.

When the data is read from the memory cell MC, the global bit lines RBLt and RBLc, the first bit line BLt, and the second bit line BLc are set at a low level, unlike the first embodiment.

After this, the signal S41 of the current source CS set at the high level is set at a constant voltage of 0V or higher, and the signal S46 of the local sense amplifier LSA set at the high level is set at the low level.

Simultaneously, when the word line WL is set at the high level, the transistors T1 and T2 are turned on, the current Icell1 flows from the current source CS to the first bit line BLt via MTJ1, and the current Icell2 flows to the second bit line BLc via the transistor T2 and MTJ2.

It is considered here that the resistance of MTJ1 is set to be double the resistance of MTJ2. The current Icell1 flowing via MTJ1 becomes a half of the current Icell2 flowing via MTJ2 as indicated by PE1 in FIG. 21. A driving force of the transistor T42 becomes weak based on the current Icell2, and the transistor T43 maintains a strong driving force based on the current Icell1. For this reason, the gate electrode of the transistor T44 becomes the low level, and the level of the gate electrode of the transistor T45 becomes higher than the level of the gate electrode of the transistor T44. For this reason, the driving force of the transistor T45 becomes weaker than the transistor T44. A potential of the global bit line RBLt therefore becomes higher than a potential of the global bit line RBLc.

When the resistance of MTJ2 is set to be double the resistance of MTJ1, oppositely to the above case, the current Icell2 flowing via MTJ2 becomes a half of the current Icell1 flowing via MTJ1 as indicated by PE2 in FIG. 21. The transistor T42 maintains a strong driving force based on the current Icell2, and a driving force of the transistor T43 becomes weak based on the current Icell1. For this reason, the level of the gate electrode of the transistor T44 becomes higher than the level of the gate electrode of the transistor T45, and the driving force of the transistor T44 becomes weaker than the transistor T45. A potential of the global bit line RBLc therefore becomes higher than a potential of the global bit line RBLt.

According to the fourth embodiment, the currents flow to MTJ1 and MTJ2 via the transistors T1 and T2, respectively, from the current source CS in the memory cell MC when the data is read. That is, since the current flows from the storage layer side to the reference layer side in each of MTJ1 and MTJ2, the data is rarely destroyed due to Disturb.

Since the data is rarely destroyed due to Disturb, the read current can be increased. For this reason, a current equal to or higher than the upper limit of the current shown in FIG. 19 can be caused to flow as shown in FIG. 21 when the data is read. A high-speed reading operation can be therefore performed.

Furthermore, since the transistors T42 and T43 are cross-coupled to each other, the time for cutting off the transistor connected to the small-current side can be shortened, similarly to the first embodiment. As a result, the ratio of the currents flowing to the first bit line BLt and the second bit line BLc can be determined at high speed. The sensing operation of the local sense amplifier LSA can be therefore accelerated.

Moreover, the signals of the first bit line BLt and the second bit line BLc can be amplified and supplied to the global bit lines RBLt and RBLc, respectively, by the local sense amplifier LSA. Variation in amplitudes of the global bit lines RBLt and RBLc having great wiring capacitance can be therefore suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
   first and second bit lines;
   a memory cell comprising a first magnetoresistive element and a first transistor serially connected between the first bit line and a power supply line, and a second magnetoresistive element and a second transistor serially connected between the second bit line and the power supply line, gate electrodes of the first and second transistors being connected to a word line;
   third and fourth transistors having current paths inserted in the first and second bit lines, gate electrodes of the third and fourth transistors being connected, respectively, to the second and first bit lines provided on a side opposite to the memory cell; and
   fifth and sixth transistors connected to the first and second bit lines of the third and fourth transistors on the side opposite to the memory cell, the fifth and sixth transistors being configured to be turned on in response to a signal indicating that data is to be read from the memory cell.

2. The device according to claim 1, further comprising third and fourth bit lines connected to the fifth and sixth transistors, respectively, and to a sense amplifier, and configured to be connected to the first and second bit lines via the fifth and sixth transistors, respectively, when data is read from the memory cell.

3. The device according to claim 1, wherein the first and second magnetoresistive elements are set to a resistance ratio of 2:1 in accordance with a current flowing between the first and second bit lines.

4. The device according to claim 1, further comprising a seventh transistor connected in parallel to the first and second transistors and configured to be turned on to write data.

5. The device according to claim 1, further comprising:
   fifth and six bit lines; and
   eighth and ninth transistors connected between the first and second bit lines, and the power supply line, gate electrodes of the eighth and ninth transistors being connected to the sixth and fifth bit lines, respectively,
   wherein the fifth and sixth transistors are controlled by potentials of the fifth and sixth bit lines when data is written in the memory cell.

6. The device according to claim 5, further comprising tenth and eleventh transistors connected between the first and second bit lines, and the fifth and sixth bit lines, the tenth and eleventh transistors being configured to apply the potentials of the fifth and sixth bit lines to the first and second bit lines when data is written in the memory cell.

7. A magnetoresistive memory device comprising:
   first and second bit lines;
   a memory cell comprising a first magnetoresistive element and a first transistor serially connected between the first bit line and a power supply line, and a second magnetoresistive element and a second transistor serially connected between the second bit line and the power supply line, gate electrodes of the first and second transistors being connected to a word line;
   third and fourth transistors having current paths inserted in the first and second bit lines, gate electrodes of the third and fourth transistors connected, respectively, to the second and first bit lines provided on a side opposite to the memory cell;
   fifth and sixth transistors connected to the first and second bit lines of the third and fourth transistors on the side opposite to the memory cell, the fifth and sixth transistors being configured to be turned on when data is read from the memory cell;
   a constant current circuit;
   a memory cell for reference; and
   a current mirror circuit having a first end, a second end and an output terminal, the first end being connected to the constant current circuit, the second end being connected to the memory cell for reference, the output terminal being connected to the gate electrodes of the fifth and sixth transistors.

8. The device according to claim 7, further comprising:
   a first circuit configured to generate, from a clock signal synchronous with inputting of a column address, a signal corresponding to an edge of the clock signal; and
   a second circuit having an output terminal connected to gate electrodes of the fifth and six transistors, and being configured to boost the level of the edge of the clock signal in accordance with the signal output from the first circuit.

9. The device according to claim 7, wherein the first and second magnetoresistive elements are set to a resistance ratio of 2:1 in accordance with a current flowing between the first and second bit lines.

10. The device according to claim 7, further comprising a seventh transistor connected in parallel to the first and second transistors and configured to be turned on to write data.

11. The device according to claim 7, further comprising:
    third and fourth bit lines; and
    eighth and ninth transistors connected between the first and second bit lines, and the power supply line, gate electrodes of the eighth and ninth transistors being connected to the fourth and third bit lines, respectively,
    wherein the fifth and sixth transistors are controlled by potentials of the third and fourth bit lines when data is written in the memory cell.

12. The device according to claim 11, further comprising tenth and eleventh transistors connected between the first and second bit lines, and the third and fourth bit lines, the tenth and eleventh transistors being configured to apply the potentials of the third and fourth bit lines to the first and second bit lines, respectively, when data is written in the memory cell.

13. A magnetoresistive memory device comprising:
first and second bit lines;
third and fourth bit lines;
a memory cell connected between the first and second bit lines, the memory cell comprising a first magnetoresistive element and a first transistor serially connected between the first bit line and a power supply line, and a second magnetoresistive element and a second transistor serially connected between the second bit line and the power supply line, gate electrodes of the first and second transistors being connected to a word line;
a current source connected to the power supply line; and
a local sense amplifier connected between the first and second bit lines, and the third and fourth bit lines,
wherein when data is read, a current flows to the first and second bit lines from the current source to the first and second bit lines via the memory cell, and the local sense amplifier senses potentials of the first and second bit lines and controls potentials of the third and fourth bit lines.

14. The device according to claim 13, wherein the first, second, third and fourth bit lines are equalized to ground potential by an equalization signal.

15. The device according to claim 13, further comprising a sense amplifier connected to the third and fourth bit lines.

16. The device according to claim 13, wherein the first and second magnetoresistive elements are set to a resistance ratio of 2:1 in accordance with a current flowing between the first and second bit lines.

17. The device according to claim 13, wherein the local sense amplifier comprises:
third and fourth transistors having current paths inserted in the first and second bit lines, gate electrodes of the third and fourth transistors connected, respectively, to the second and first bit lines provided on a side opposite to the memory cell; and
fifth and sixth transistors connected between a power supply node and the third bit line and between the power supply node and the fourth bit line, respectively, a gate electrode of the fifth transistor being connected to the first bit line, a gate electrode of the sixth transistor being connected to the second bit line.

18. The device according to claim 13, further comprising a seventh transistor connected in parallel to the first and second transistors and configured to be turned on to write data.

19. The device according to claim 13, further comprising:
fifth and sixth bit lines; and
eighth and ninth transistors connected between the first and second bit lines, and the power supply line, gate electrodes of the eighth and ninth transistors being connected to the sixth and fifth bit lines, respectively.

20. The device according to claim 19, further comprising:
tenth and eleventh transistors connected between the first and second bit lines, and the fifth and sixth bit lines, the tenth and eleventh transistors being configured to apply the potentials of the fifth and sixth bit lines to the first and second bit lines, respectively, when data is written in the memory cell.

* * * * *